(12) United States Patent
Hayden

(10) Patent No.: US 6,230,276 B1
(45) Date of Patent: May 8, 2001

(54) ENERGY CONSERVING MEASUREMENT SYSTEM UNDER SOFTWARE CONTROL AND METHOD FOR BATTERY POWERED PRODUCTS

(76) Inventor: Douglas T Hayden, 1220 N. 20th St., Boise, ID (US) 83702

( * ) Notice: Subject to any disclaimer, the term of this patent is extended or adjusted under 35 U.S.C. 154(b) by 0 days.

(21) Appl. No.: 09/241,327

(22) Filed: Feb. 1, 1999

(51) Int. Cl.[7] .................................................. G06F 1/32
(52) U.S. Cl. ...................... 713/320; 713/324; 713/321; 716/4
(58) Field of Search ..................... 713/300, 320, 713/324, 321; 702/127; 716/4; 361/79, 86; 307/126; 324/416; 711/103; 315/291

(56) References Cited

U.S. PATENT DOCUMENTS

| | | |
|---|---|---|
| 4,081,801 | 3/1978 | Thomas . |
| 4,203,153 | 5/1980 | Boyd . |
| 4,238,784 * | 12/1980 | Keen et al. . |
| 4,381,552 | 4/1983 | Nocilini . |
| 4,961,008 | 10/1990 | Fujiwara . |
| 5,254,992 * | 10/1993 | Keen et al. . |
| 5,777,837 * | 7/1998 | Eckel et al. . |
| 6,087,843 * | 7/2000 | Pun et al. . |

* cited by examiner

Primary Examiner—Gopal C. Ray

(57) ABSTRACT

A battery powered device using a method for efficiently supplying operational power to a measurement system for brief periods of time for the purpose of maximizing battery life while minimizing circuit size and cost is described. The device employs a highly integrated, low power consumption microcontroller with general purpose output port pins whose logic level is under control of a software program. The microcontroller output pins contain substantial series impedance to the power supplying or power returning terminal which prohibits significant current delivery through the port pin and therefore normally limits the use of such output pins to setting a digital signal status into other logic circuitry. Also contained within the device is a differential voltage comparator being used as a measurement system which requires a substantial supply current to operate. Operating the measurement system continuously from the battery supply would reduce the lifetime of the battery powered device substantially and using external switching devices for controlling power delivery to the measurement system adds cost and complexity to the device. The device described provides for operation of the measurement system by pulsed power supplied directly from an output port of the microcontroller.

17 Claims, 2 Drawing Sheets

ENERGY CONSERVING MEASUREMENT SYSTEM UNDER SOFTWARE CONTROL AND METHOD FOR BATTERY POWERED PRODUCTS

BACKGROUND OF THE INVENTION

1. Field of the Invention

This invention is related to an electric circuit involving controlled discharge of a battery or other limited energy source in a system using electrical transmission through a microcontroller operated by software control to provide on/off voltage regulation to a second measurement system or circuit for the purpose of conserving energy using a minimum quantity of circuit components to minimize circuit size and cost.

2. Prior Art

In U.S. Pat. No. 4,961,008 by Fujiwara et al., power reduction in a low power circuit is achieved by using a separate clock circuit which is continuously powered while simultaneously applying power in a pulsed fashion to a processing circuit. The power switching between the clock circuit and processing circuit is relatively complex, using power transmission through separate paths, multiple voltage switching devices, and voltage boosting circuits to conserve power in the clock circuit only without minimizing circuit size and cost.

In U.S. Pat. No. 4,203,153 by Boyd, power consumption is reduced in a microprocessor based system by using devices external to the microprocessor such as timers and analog switches to provide temporary power to the microprocessor itself in a pulsed fashion. The timer and switching circuit implement the power switching in a complex fashion to conserve power in the microprocessor only without minimizing circuit size and cost.

In U.S. Pat. No. 5,254,992 by Keen et al., 4,081,801 by Thomas et al., and 4,238,784 by Keen et al., a system is disclosed which uses a microprocessor to switch power to a load cell in a pulsed manner. However, the power is supplied to the load cell from a discrete power supply circuit and application of power to the load cell is by discrete switches operated by a signal from the microprocessor, located between the discrete power supply and the load cell. The process of switching the power requires relatively complex external circuitry and voltage sources without minimizing circuit size and cost.

In U.S. Pat. No. 4,381,552 by Nocilini et al., a standby mode for a microprocessor and memory system is disclosed which uses devices external to the microprocessor such as logic and external switching transistors to provide power saving features to the system. The process of switching the power requires relatively complex external logic circuitry and voltage switching devices without minimizing circuit size and cost.

In U.S. Pat. No. 6,087,843 by Pun et al., a switching device is used to sequentially insert and remove a large stabilizing capacitor in parallel with a device under test, with the purpose of stabilizing the voltage during periods of high current consumption while inserted and minimizing current leakage and measurement noise during static operation when removed. Power is supplied to the device under test continuously by a combination of distributed elements with no effort to conserve energy or to minimize overall circuit size and cost.

In U.S. Pat. No. 5,777,837 by Eckel et al., a regulated direct current source is provided under microcontroller control using an additional combination of external logic devices, rectifiers, and voltage switching devices to provide further control of an alternating current source to a load using a combination of relays or external semiconductor switching devices. With the primary goal of providing a safe level of alternating current draw in the system OFF state, neither the circuit size nor cost is minimized.

BRIEF SUMMARY OF THE INVENTION

The objective of this invention is to disclose a device which contains an electric circuit which solves the previously discussed problems and provides a method of power conservation. To meet the objectives, this invention includes:

- a microprocessor or microcontroller containing controllable output ports or pins; and
- a battery or capacitor for supplying power to the system; and
- a sequential program operating the output ports of the microcontroller in a deterministic manner; and
- a measurement circuit or other electric circuit whose function is not required continuously and whose power may be conserved.

For battery powered products, battery life is a highly marketable feature and extending that life more than a few percent is significant and can provide competitive advantage over competing products. Therefore, the device described should be used whenever significant power conservation can be realized and is only limited by the compatibility between the power transfer ability of the microcontroller or microprocessor output port and the measurement circuit or other electrical circuit whose power may be conserved through intermittent operation.

DETAILED DESCRIPTION OF THE PREFERRED EMBODIMENTS

Figure 1:
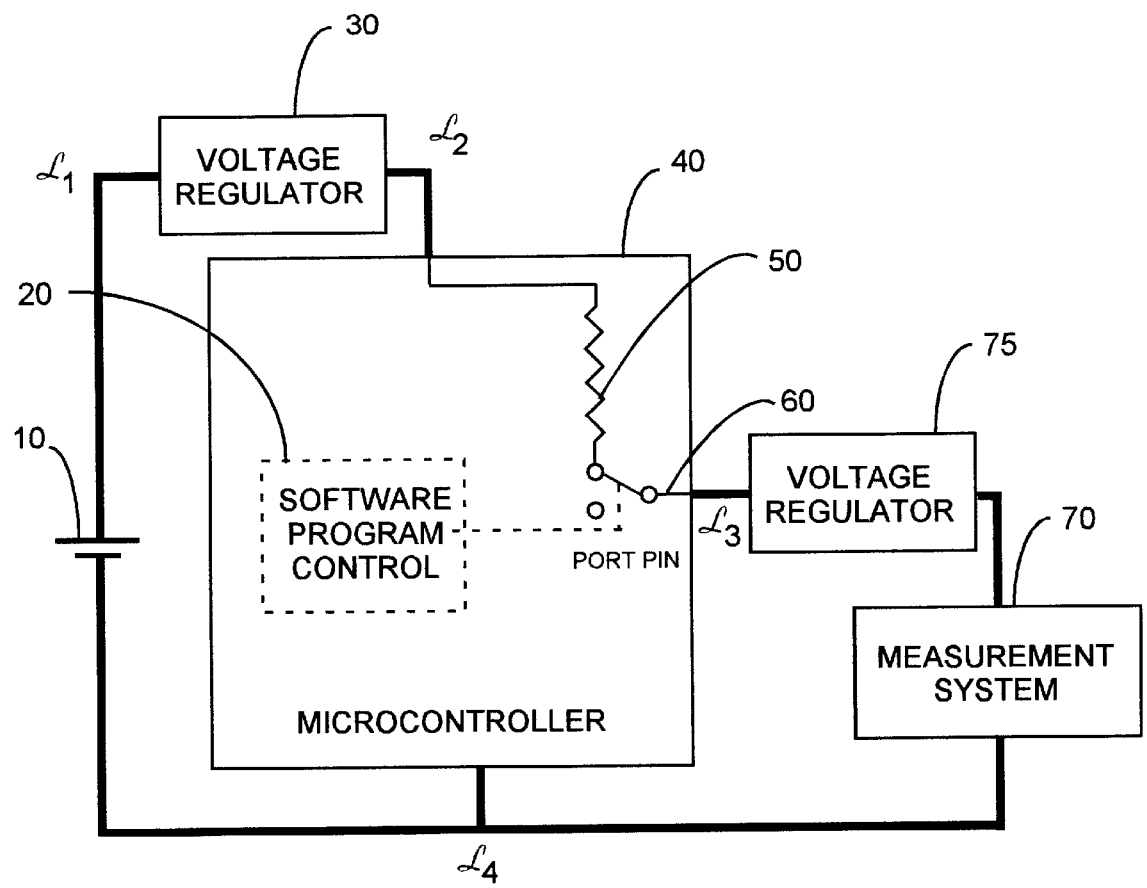
FIG. 1 shows a block diagram with simplification and optional features of the system disclosed.

Referring to FIG. 1, a limited energy power source 10, such as a charged capacitor, active coupled power source, or battery is connected to a microcontroller 40 by conducting paths $L_1$ and $L_2$ using intermediate voltage regulator 30 as required for proper operation of microcontroller 40 for the purposes of powering microcontroller 40 to run a software program 20 and for ultimately powering a measurement system 70. Voltage regulator 30 uses a series, shunt, linear, or switching type device as required for proper operation of microcontroller 40 and is connected between power source 10 and microcontroller 40 by conducting paths $L_1$ and $L_2$ as shown. If no voltage regulation is required for proper operation of microcontroller 40, conducting paths $L_1$ and $L_2$ would provide direct connection from power source 10 to the power input terminal of microcontroller 40. Other common devices required to operate a microcontroller based system are not shown for clarity.

A measurement system or circuit 70 requiring substantial current to operate is connected to an output port pin or multiple output port pins 60 of microcontroller 40 by conducting path $L_3$ using intermediate voltage regulator 75 as required for proper operation of measurement system 70 for the purpose of powering measurement system 70 under control of microcontroller 40 and software program 20. Substantial current is considered any more than a few percent of the microcontroller current since battery life is a highly marketable feature for battery powered products and extending the operational life is significant and provides advantage over competing products. Voltage regulator 75 uses a series, shunt, linear, or switching type device as required for proper operation of measurement system 70 and would be connected between output port pins 60 of microcontroller 40 and the power input terminal of measurement system 70 if required. If no additional voltage regulation is required for proper operation of measurement system 70, conducting path $L_3$ would provide direct connection from output port pin 60 to the power input terminal of measurement system 70.

To provide intermittent power to energize and deenergize measurement system 70, output port pins 60 are driven in a manner to alternately provide and impede electrical connectivity between power supply input pin of microcontroller 40 and output port pins 60 through some substantial internal impedance 50. Multiple microcontroller port pins 60 may be connected in parallel, which are also represented by port pins 60 and conductive path $L_3$, to effectively reduce internal impedance 50 of the transmission path between the power supply input pin of microcontroller 40 and output port pin 60 to provide the power transmission capacity necessary to energize measurement system 70. Microcontroller 40 and measurement system 70 share a conductive current return path $L_4$ to power source 10 for returning power to the source. No additional paths for supplying power to measurement system 70 are provided other than through output port pins 60 by $L_3$ when measurement system 70 and microcontroller 40 share current return path $L_4$ thereby minimizing circuit size and cost.

Port pins 60 can be alternately driven to a logic high state and a logic low or high-impedance state either by direct software control 20, a reset state, or by other logic contained within the microcontroller which have provisions to directly alter the logic state of output pins 60 deterministically upon known operating conditions controlled by time based events or other activity contained within or sensed by microcontroller 40. Software program 20 is contained either internally or externally to microcontroller 40 in a program storage device and drives the logic states of output port pin 60. Port pins 60 are driven to the logic high state to energize measurement system 70 by providing adequate power at output port pins 60 to establish a voltage bias across measurement system 70 referenced to the conductive current return path $L_4$ with a current adequate to energize measurement system 70. Port pins 60 are driven to the logic low or high-impedance state to deenergize measurement system 70 by impeding current flow at output port pins 60 required to establish a voltage bias across measurement system 70 referenced to the conductive current return path $L_4$.

Figure 2:
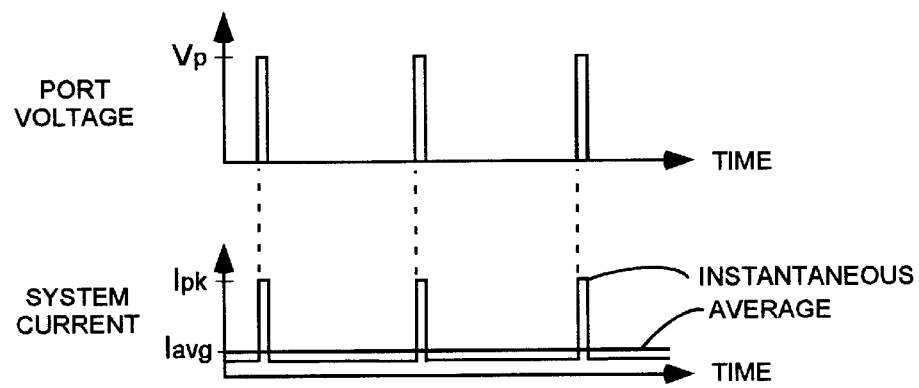
FIG. 2 shows a graphical representation of the switched voltage, instantaneous system current, and average system current related to the system diagram of FIG. 1.

Referring to FIG. 2, when output port pins 60 are driven to the logic high state to energize measurement system 70, a voltage Vp appears at output port pins 60 while output port pins 60 provide the current required to energize measurement system 70 by allowing a current shown as $I_{pk}$ to flow internal to microcontroller 40 through internal impedance 50 and out port pins 60 ultimately to energize measurement system 70. The voltage bias and current or power supplied by microcontroller 40 at port pin 60 is able to provide a voltage and current or power higher than the minimum current and voltage or power required by measurement system 70 for proper operation. The time duration of the logic high level is determined by the settling time of measurement system 70 after power is provided and the acquisition time of the recipient of the measuring system's signal.

When output port pins 60 are driven to the logic low or high-impedance state to deenergize measurement system 70, current is impeded out of port pins 60 to measurement system 70 which substantially reduces the voltage at output port pins 60 referenced to the conductive current return path $L_4$ thereby conserving the power consumed by measurement system 70 in the energized state. The time duration of the logic low or high-impedance state is ideally determined by the required update rate of the measured parameter provided by measurement system 70. The longer the duration of the logic low or high-impedance state, the more energy is conserved by the system with the pulsing of the power to measurement system 70 having the effect of averaging the system instantaneous current over time to produce a substantially lower average system current shown as $I_{avg}$ in FIG. 2.

Referring to FIG. 1, the preferred embodiment of the invention uses a 9 volt battery as power source 10, Telcom's TC55 as voltage regulator 30, Samsung's KS56C820 as microcontroller 40, and a low operating voltage differential voltage comparator such as National Semiconductor's LMC7211 as measurement circuit 70 in a system where voltage regulator 75 is not required. The TC55 provides a 3.3 volt output voltage from the nominal 9 volt battery which is adequate to power the KS56C820 microcontroller. The KS56C820 which nominally consumes 30 $\mu$A of current is used to directly switch voltage and current to the comparator which nominally consumes 12 $\mu$A by connecting the power supply input pin of the comparator to an output port pin of the microcontroller. No intermediate voltage regulator is required on the output port pin of the KS56C820 for proper operation of the LMC7211. While the preferred embodiment uses a differential voltage comparator as measurement system 70, measurement system 70 can be any electrical, chemical, or environmental sensing circuit or any circuit requiring electrical power that may be conserved by intermittent operation.

The preferred embodiment of the invention provides a direct connection from microcontroller output port 60 by $L_3$ with output port 60 having an output structure that provides at least an active pull-up or drive feature such as Port 3 of Samsung's KS56C820 microcontroller (port type "D-A", reference Samsung 4-Bit KS56 Series Microcontroller Databook, KS56C220/820/1620 Datasheet, 1995 Rev 2). The 3.3 volt supply voltage to the KS56C820 microcontroller provides a minimum output logic high level of 2.8 volts at a load of 100 $\mu$A at port pin 60 when controlled to drive a logic high level. In the preferred embodiment of the invention, the differential voltage comparator can operate with a supply voltage down to 2.7V at a current draw of 14 $\mu$A maximum.

The software program contained within the KS56C820 drives the output port pin to a logic high state for approximately 2 milliseconds every 500 milliseconds, providing power conservation of 99.6 percent of the amount required by a constantly powered LMC7211 While the preferred embodiment of the invention provides for software program 20 to be contained within microcontroller 40 in masked ROM, using any program storage such as ROM, EEPROM, PROM, RAM or similar storage would provide the same functionality.

Figure 3:
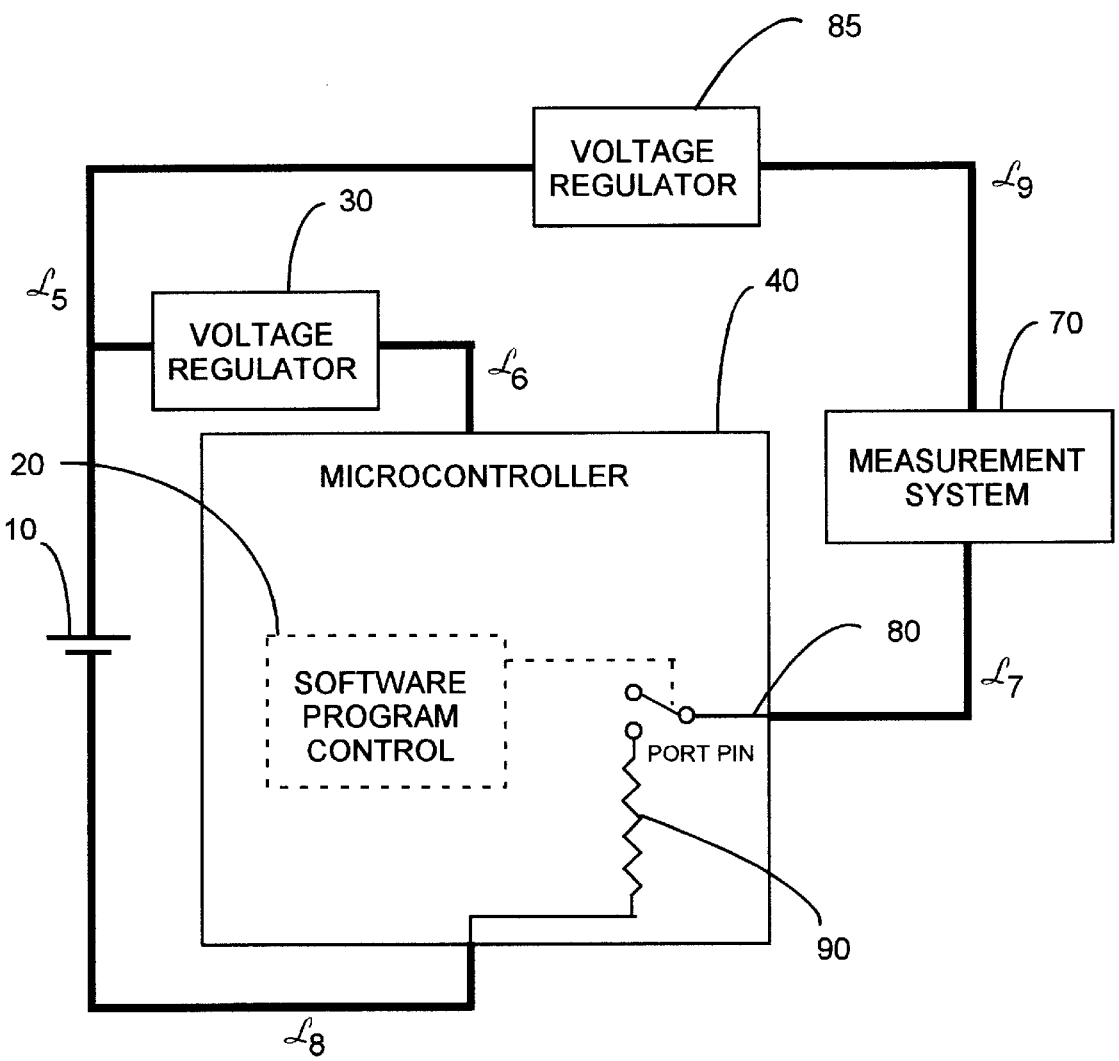
FIG. 3 shows a block diagram with simplification and optional features of an alternate implementation of the system disclosed.

Referring to FIG. 3, a person skilled in the art could similarly envision a system where a continuous voltage is supplied from power source 10 to microcontroller 40 by conductive transmission paths $L_5$ and $L_6$ using intermediate voltage regulator 30 as required for proper operation of microcontroller 40 with a current return path for microcontroller 40 by transmission path $L_8$ to power source 10 for the purpose of powering microcontroller 40. A continuous voltage is supplied to measurement system 70 by conductive transmission paths $L_5$ and $L_9$ using intermediate voltage regulator 85 as required for proper operation of measurement system 70 with a current return path for measurement system 70 by conductive path $L_7$ through the microcontroller port pin or pins 80. Voltage regulator 30 and voltage regulator 85 can provide voltage regulation using series, shunt, linear, or switching type devices if required.

Port pin or pins 80 have characteristics of a voltage rating capable of sustaining the voltage supplied to measurement system 70 without damage or degradation of the port pins and a current carrying capacity adequate to properly energize measurement system 70 when so driven. Port pin 80 is the type to have an output structure that provides at least an active pull-down feature in preferably an open drain configuration.

The active pull-down state creates a path with some substantial impedance 90 between output port pin 80 and the current return pin of microcontroller 40 while the open drain state ideally prohibits any current flow into or out of port pin 80. Multiple microcontroller port pins 80 may be connected in parallel, which are also represented by port pins 80 and conductive path $L_7$, to effectively reduce internal impedance 90 of the transmission path between the power supply return pin of microcontroller 40 and output port pin 80 to provide the power transmission capacity necessary to energize measurement system 70. The power return current back to power source 10 from measurement system 70 and microcontroller 40 is through microcontroller 40 and transmission path $L_8$ as shown with no additional transmission path for returning power from measurement system 70 to power source 10 provided other than through the port pin or pins 80 by $L_7$ thereby minimizing circuit size and cost.

The operation of the port pin or pins 80 would be the same as disclosed previously with the exception of providing a logic low to energize measurement system 70 and a high-impedance at port pin 80 to deenergize measurement system 70 to conserve the power normally consumed by measurement system 70. This alternate implementation shown in FIG. 3 to provide a controlled power return path to measurement system 70 through microcontroller 40 would in fact provide the same power conservation features as the implementation in FIG. 1 while using a minimum quantity of circuit components to minimize circuit size and cost.

I claim:

1. A circuit for substantially conserving energy in a microcontroller based system, comprising:
    (a) a microcontroller integrated circuit having general purpose output port pins,
    (b) a voltage sourcing means directly connected to a power input terminal of said microcontroller,
    (c) a measurement system or circuit requiring substantial operating power,
    (d) a supply transmission means for transferring power from said output port pins of said microcontroller to said measurement system or circuit,
    (e) a driving means for selectively driving said output port pins of said microcontroller so as to be able to alternately energize and deenergize said measurement system or circuit, and
    (f) a common return transmission means for returning power from said microcontroller and said measurement system or circuit to said voltage source.

2. A circuit as claimed in claim 1 and in which said voltage sourcing means is a device with substantially limited source of power selected from the group of batteries, charged capacitors, and temporary actively coupled power sources with voltage regulating means between said voltage sourcing means and said microcontroller as required to operate said microcontroller.

3. A circuit as claimed in claim 1 and in which said driving means is selected from the group consisting of direct software control, a reset state, and other logic contained within said microcontroller which has the ability to directly alter the logic state of said output port pins deterministically.

4. A circuit as claimed in claim 3 and in which said software control for selectively driving said output port pins of said microcontroller is contained internal or externally to said microcontroller in a program memory storage device.

5. A circuit as claimed in claim 1 and in which said supply transmission means provides required operating voltage and current to said measurement system or circuit by direct connection to a single or plurality of said output port pins of said microcontroller with intermediate voltage regulating means as required by said measurement system or circuit for proper operation of said measurement system.

6. A system as claimed in claim 1 and in which said measurement system or circuit is a voltage comparator.

7. A circuit for substantially conserving energy in a microcontroller based system, comprising:
    (a) a microcontroller integrated circuit having general purpose output port pins,
    (b) a measurement system or circuit requiring substantial operating power,
    (c) a common voltage sourcing means connected by supply transmission means to power input terminals of said microcontroller and said measurement system or circuit,
    (d) a directly connected return transmission means for returning power from said measurement system or circuit to said output port pins of said microcontroller,
    (e) a driving means for selectively driving said output port pins of said microcontroller so as to be able to alternately energize and deenergize said measurement system or circuit, and
    (f) a power transmission means for returning power from said microcontroller to said voltage sourcing means.

8. A circuit as claimed in claim 7 and in which said voltage sourcing means is a device with substantially limited source of power selected from the group of batteries, charged capacitors, and temporary actively coupled power sources.

9. A circuit as claimed in claim 7 and in which said supply transmission means provides required operating voltage and current to said microcontroller with intermediate voltage regulating means as required to operate said microcontroller.

10. A circuit as claimed in claim 7 and in which said supply transmission means provides required operating voltage and current to said measurement system or circuit with intermediate voltage regulating means as required to operate said measurement system or circuit.

11. A circuit as claimed in claim 7 and in which said return transmission means provides required operating voltage bias to said measurement system or circuit by direct connection to a single or plurality of said output port pins of said microcontroller.

12. A circuit as claimed in claim 7 and in which said driving means is selected from the group consisting of direct software control, a reset state, and other logic contained within the microcontroller which has the ability to directly alter the logic state of said output port pins deterministically.

13. A circuit as claimed in claim 12 and in which said software control for selectively driving said output port pins of said microcontroller is contained internal or externally to said microcontroller in a program memory storage device.

14. A circuit as claimed in claim 7 and in which said measurement system or circuit is a voltage comparator.

15. A method for substantially conserving energy and minimizing quantity of components in a microcontroller based system of a type wherein said microcontroller having provision to deterministically and directly alter the logic state of output port pins of said microcontroller is operated to alternately directly energize and deenergize a second circuit comprising the steps of driving said output port pins of said microcontroller in a manner to provide an electrical connection between a voltage source and said output port pins of said microcontroller through some substantial internal impedance; providing adequate power transmission means from said microcontroller to said second circuit by the usage of a plurality of said output port pins as required to substantially reduce said effective internal impedance for proper operation of said second circuit; providing a voltage bias referenced to said voltage source and a current through said transmission means to said second circuit adequate for proper operation of said second circuit for the purpose of energizing said second circuit; maintaining said voltage bias and current to said second circuit during required operational periods of said second circuit; driving said output port pins of said microcontroller in a manner to provide substantial impedance between said voltage source and said output port pins thereby removing said voltage bias and impeding current through said transmission means to said second circuit for the purpose of deenergizing said second circuit whereby the average energy of the system is substantially conserved and circuit size and cost are minimized.

16. A method as claimed in claim 15 and in which said power transmission means from said microcontroller to the power supplying port of said second circuit includes intermediate voltage regulating means between said output port pins and said power supplying port as required for proper operation of said second circuit where said microcontroller and said second circuit share a common power return transmission means to said voltage source whereby the circuit size and cost are minimized.

17. A method as claimed in claim 15 and in which a power return transmission means between said microcontroller to said voltage source with a microcontroller power transmission means from said voltage source to the power supplying port of said microcontroller includes intermediate voltage regulating means between said voltage source and said power supplying port of said microcontroller as required for proper operation by said microcontroller and in which a second circuit power transmission means from said voltage source to the power supplying port of said second circuit includes intermediate voltage regulating means between said voltage source and said power supplying port of said second circuit as required for proper operation by said second circuit and in which said power transmission means from said microcontroller to said second circuit provides a power returning path to said voltage source whereby the circuit size and cost are minimized.

* * * * *